(12) United States Patent
Kautzsch

(10) Patent No.: US 10,948,513 B2
(45) Date of Patent: Mar. 16, 2021

(54) ELECTRONIC DEVICE HAVING A FIRST ELECTRODE FORMED ON A MOVABLE SUSPENDED MASS OPPOSING A SECOND ELECTRODE FORMED ON A COVER LAYER

(71) Applicant: Infineon Technologies AG, Neubiberg (DE)

(72) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 478 days.

(21) Appl. No.: 14/518,013

(22) Filed: Oct. 20, 2014

(65) Prior Publication Data

US 2016/0107879 A1 Apr. 21, 2016

(51) Int. Cl.
| | | |
|---|---|---|
| *B81B 3/00* | (2006.01) | |
| *G01P 15/125* | (2006.01) | |
| *B81C 1/00* | (2006.01) | |
| *G01P 15/11* | (2006.01) | |
| *G01P 15/08* | (2006.01) | |

(52) U.S. Cl.
CPC .......... *G01P 15/125* (2013.01); *B81B 3/0021* (2013.01); *B81C 1/00142* (2013.01); *G01P 15/11* (2013.01); *B81B 2201/0235* (2013.01); *B81B 2203/0136* (2013.01); *B81B 2203/0315* (2013.01); *B81B 2203/04* (2013.01); *G01P 2015/0814* (2013.01)

(58) Field of Classification Search
CPC ............... B81B 3/0021; B81B 3/0027; B81B 2203/0136; B81C 1/0015; B81C 1/00166; B81C 1/00182; B81C 1/00198; H01G 5/14; H01H 7/12; G01P 15/11
See application file for complete search history.

(56) References Cited

U.S. PATENT DOCUMENTS

| | | | |
|---|---|---|---|
| 6,867,459 B2* | 3/2005 | Burden | ................... C30B 23/02 257/347 |
| 8,101,448 B2* | 1/2012 | Renna | ................. B81C 1/00158 257/E21.573 |
| 8,212,450 B2* | 7/2012 | Mabuchi | ................ H02N 1/004 310/309 |
| 2014/0264649 A1* | 9/2014 | Schelling | ........... G01C 19/5769 257/415 |

OTHER PUBLICATIONS

Sato, et al. "Fabrication of Silicon-on-Nothing Structure by Substrate Engineering . . . ", Japanese Journal of Applied Physics, vol. 43, No. 1, 2004, pp. 12-18.

(Continued)

*Primary Examiner* — Anh D Mai
(74) *Attorney, Agent, or Firm* — Eschweiler & Potashnik, LLC

(57) ABSTRACT

An electronic device is based on a single crystal semiconductor substrate. A cavity is formed in the semiconductor substrate. Further, a movably suspended mass is defined by one or more trenches extending from one side of the semiconductor substrate to the cavity. A first electrode layer is provided on the suspended mass. Further, a cover layer covering the suspended mass is provided. The cover layer includes a second electrode layer arranged opposite to the first electrode layer and spaced therefrom by a gap.

8 Claims, 10 Drawing Sheets

(56) References Cited

OTHER PUBLICATIONS

Altena et al "Design, Modeling, Fabrication and Characterization of an Electret-Based MEMS Electrostatic Energy Harvester", IEEE Transducers 2011.
Schaijk "Energy Harvesting for self-powered Sensor Systems", IEEE IEDM 2013, Conference Tutorial.
Altena et al "Innovative micropower solutions for Wireless Autonomous Sensor Nodes", 2nd European Conference & Exhibition on Integration Issues of Miniaturized Systems. Apr. 2008.
Leonov et al "Charge Retention in a Patterned $SiO_2/Si_3N_4$ Electret", IEEE Sensors Journal, vol. 13, No. 9, Sep. 2013.
Altena et al "Design improvements for an electret-based MEMS vibrational electrostatic energy harvester", Journal of Physics: Conferenc Series 476 (2013) 012078, PowerMEMS 2013, IOP Publishing.
Lee et al "3D Silicon Transformation using Hydrogen Annealing", 2004.

* cited by examiner

PREPARE CAVITY

PREPARE
ELECTRODE LAYER

DEFINE SUSPENDED
MASS

PREPARE COVER
LAYER

REMOVE SACRIFICIAL LAYER

ELECTRONIC DEVICE HAVING A FIRST ELECTRODE FORMED ON A MOVABLE SUSPENDED MASS OPPOSING A SECOND ELECTRODE FORMED ON A COVER LAYER

FIELD

The present application relates to an electronic device and to a method of manufacturing an electronic device.

BACKGROUND

In the field of micro-electro-mechanical systems (MEMS), it is known to suspend certain elements of a semiconductor material, to thereby combine electronic functionalities with mechanical actions. Examples of such MEMS are accelerometers in which movement of a suspended mass is detected on the basis of capacitive coupling of an electrode on the suspended mass to a counter-electrode. Another example of such MEMS are energy harvesters in which movement of a suspended mass is converted to electric energy by utilizing electrostatic coupling of an electrode on the suspended mass to a counter-electrode.

However, in some cases such MEMS devices may be difficult to integrate with other circuitry, may suffer from excessive production costs, or may lack scalability. This may for example result from the requirement to, on the one hand, prepare the suspended mass from a semiconductor by utilizing sophisticated etching processes, while further requiring accurate positioning of electrodes or other circuit structures on the suspended mass or in proximity to the suspended mass. For example, in "DESIGN, MODELING, FABRICATION AND CHARACTERIZATION OF AN ELECTRET-BASED MEMS ELECTROSTATIC ENERGY HARVESTER", G. Altena et al., Transducers'11, Beijing, China, Jun. 5-9, (2011), an electrostatic energy harvester is described which is based on bonding three different wafers onto each other. In this structure, a seismic mass is prepared in an SOI (Silcon On Insulator) wafer, and a support wafer providing metal contact layers and an electret wafer are bonded to both sides of the SOI wafer.

Accordingly there is a need for techniques which allow for efficiently providing an electronic device equipped with a suspended mass.

SUMMARY

According to an embodiment, an electronic device is based on a single crystal semiconductor substrate. A cavity is formed in the semiconductor substrate. Further, a moveably suspended mass is defined by one or more trenches extending from one side of the semiconductor substrate to the cavity. A first electrode layer is provided on the suspended mass. Further, a cover layer covering the suspended mass is provided. The cover layer includes a second electrode layer arranged opposite to the first electrode layer and spaced therefrom by a gap.

According to further embodiments of the disclosure, other devices or methods may be provided. Such embodiments will be apparent from the following detailed description in connection with the accompanying drawings.

DETAILED DESCRIPTION

In the following, various embodiments will be described in detail with reference to the accompanying drawings. It should be noted that these embodiments serve only as examples and are not to be construed as limiting. For example, while embodiments with a plurality of features, other embodiments may comprise less features and/or alternative features. Furthermore, features from different embodiments may be combined with each other unless specifically noted otherwise.

Embodiments as illustrated in the following relate to an electronic device. The electronic device is provides a suspended mass which is formed from semiconductor material of the electronic device. The suspended mass is moveable with respect to other structures of the electronic device, and the electronic device is configured to convert such mechanical movement is converted to electric signals.

The electronic device may for example correspond to an electromechanical accelerometer, in which movement of the suspended mass may be detected on the basis of capacitive coupling of an electrode on the suspended mass to a counter-electrode. Further, the electronic device may correspond to an energy harvester, in which movement of the suspended mass may be converted to electric energy by utilizing electrostatic coupling of an electrode on the suspended mass to a counter-electrode.

Figure 1:
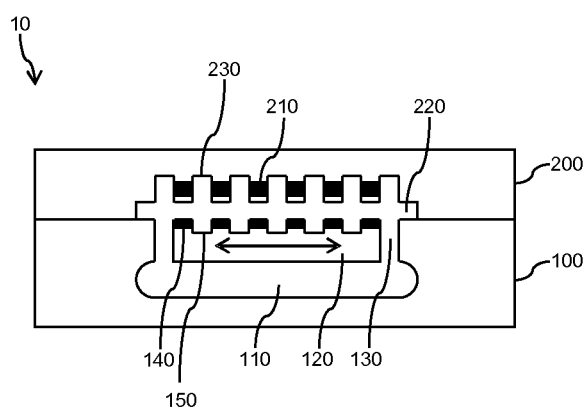
FIG. 1 schematically illustrates an electronic device according to an embodiment of the disclosure.

FIG. 1 schematically illustrates example structures of the electronic device 10.

As illustrated, the electronic device 10 includes a semiconductor substrate 100. In the illustrated examples, the semiconductor substrate 100 is a single crystal substrate, e.g., a single crystal silicon substrate. A cavity 110 is formed within the semiconductor substrate 100. As further explained below, the cavity 110 may be prepared by a Silicon-On-Nothing (SON) process.

The cavity 110 is located beneath an upper surface of the semiconductor substrate 100. On this upper surface electronic circuitry of the electronic device 100 may be prepared, e.g., using conventional complementary metal-oxide semiconductor (CMOS) technology. As example elements of such electronic circuitry, FIG. 1 shows an electrode layer 140. The electrode layer 140 may for example be prepared by selectively doping certain parts of the semiconductor substrate.

As further illustrated, a suspended mass 120 is formed from the semiconductor substrate 100. The suspended mass 120 corresponds to a part of the semiconductor substrate 100 which covers the cavity 110. The electrode layer 140 is located on that part of the semiconductor substrate 100 which corresponds to the suspended mass 120.

The suspended mass 120 is defined by one or more trenches 130 which extends from the upper surface of the semiconductor substrate 100 to the cavity 110.

Accordingly, the suspended mass 120 is a part of the semiconductor substrate 100. Laterally, the suspended mass 120 is partially separated by the trenches 130 from the rest of the semiconductor substrate 100. Vertically, the suspended mass 120 is separated by the cavity 110 from the semiconductor substrate 100. The lateral separation of the suspended mass 120 from the rest of the semiconductor substrate is not continuous, so that one or more suspension structures (not illustrated in FIG. 1) are formed through which the suspended mass 120 is connected to the rest of the semiconductor substrate 100. Accordingly, the suspended mass 120 is moveable by elastic deformation of the suspension structures. The suspension structures may be designed according to desired movement characteristics of the suspended mass 120. In the illustrated example, the suspended mass 120 is assumed to be movable in a lateral direction, as indicated by a double-headed arrow in FIG. 1.

The electronic device 100 further includes a cover layer 200. The cover layer 200 is formed on the upper surface of the semiconductor substrate 100. The cover layer 200 may for example correspond to a dielectric material which is deposited on the upper surface of the semiconductor substrate 100.

The cover layer 200 includes a further electrode layer 210 which is located vertically above the electrode layer 140 and is separated therefrom by a gap 220. The gap 220 is formed between the cover layer 200 and that part of the semiconductor substrate 100 which corresponds to the suspended mass 120. The gap 220 vertically separates the suspended mass 120 from the cover layer 200, so that the movement of the suspended mass 120 is not affected by the cover layer 200. The further electrode layer 210 may for example be formed as an electret layer, e.g., by embedding conductive electrode structures in the dielectric material of the cover layer 200. The conductive electrode structures may for example be formed of polycrystalline silicon, metal, or another suitable material.

The cover layer 200 may also be based on an interlevel dielectric (ILD) structure with multiple dielectric layers of different dielectric constants. Further, the cover layer 200 may also include one or more metallization layers, e.g., for coupling to the electrode layer 140, to the further electrode layer 210, or to other electronic circuitry of the electronic device 10.

The electrode layer 140 and the further electrode layer 210 may each include electrode structures in the form of finger electrodes. For example, the electrode layer 140 may include a first set of comb like electrode fingers, and the further electrode layer 210 may include a second set of comb like electrode fingers. The electrode fingers of both sets may extend in a lateral direction, substantially perpendicular to the lateral direction of movement of the suspended mass 120. Accordingly, the movement of the suspended mass 120 may have the effect of shifting the first set of comb like electrode fingers with respect to the second set of comb like electrode fingers.

The suspended mass 120 may move between a first position, in which each electrode finger of the first set is aligned with an electrode finger of the second set, and a second position, in which each electrode finger of the first set is aligned with a space between two electrode fingers of the second set. In this disclosure, second position is contemplated as comprising not only an alignment with the space, but any position different than the first position such that electrode fingers of the first and second set are not substantially aligned. FIG. 1 illustrates the suspended mass 120 in the first position. In the first position, strong capacitive coupling between the first set of comb like electrode fingers and the second set of comb like electrode fingers can be achieved. As compared to that, lower capacitive coupling occurs in the second position. When applying a static electric charge to the further electrode layer 210, the variations in the capacitive coupling caused during the movement of the suspended mass 120 cause charge fluctuations in the electrode layer 140, which in turn may be converted to electric signals for acceleration detection purposes or energy harvesting purposes. For energy harvesting applications, the further electrode layer 210 may be charged to a static potential of 10 V to 50 V, for example. For accelerometer applications, lower static potentials may be sufficient. The further electrode layer 210 may for example be on a floating potential and may be charged by tunnel currents. This may allow for efficiently pre-charging the further electrode layer 210 to a desired potential.

As further illustrated, the electrode layer 140 may be provided with recesses 150 separating the electrode fingers of the first set of comb like electrode fingers from each other. Similarly, the further electrode layer 210 may be provided with recesses 230 separating the electrode fingers of the first set of comb like electrode fingers from each other. The recesses 150 and/or the recesses 210 may help to reduce lateral coupling between the first set and second set of comb like electrode fingers and thereby to provide a higher degree of efficiency. This may in turn allow usage of lower static potentials for charging the further electrode layer 210, thereby reducing the risk of a so-called pull-in, in which the suspended mass 120 is pulled against the cover layer 200.

Figure 2:
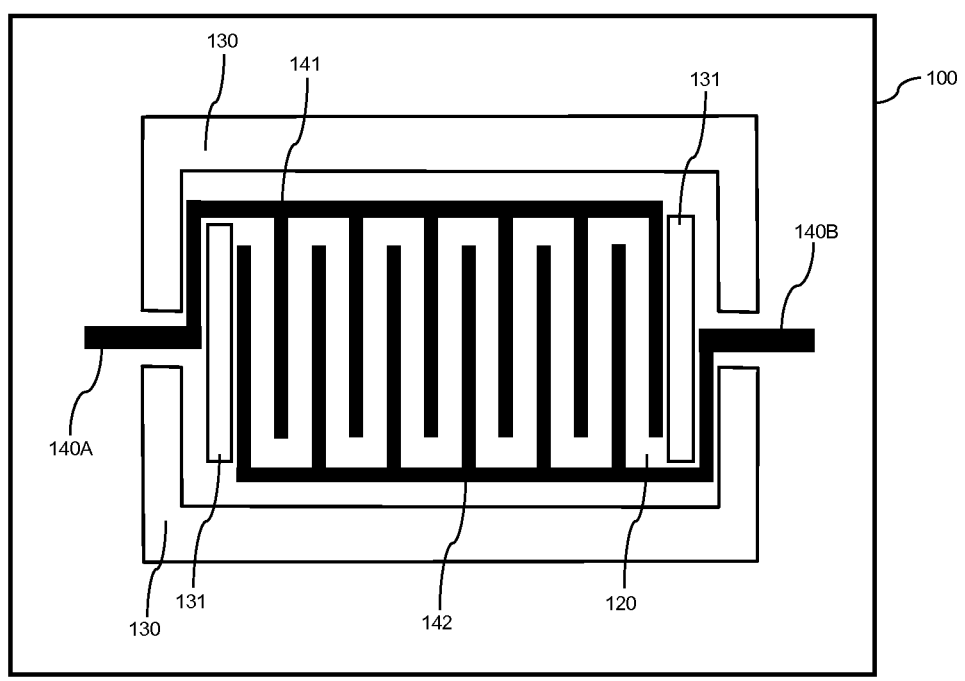
FIG. 2 shows an electrode configuration according to an embodiment of the disclosure.

FIG. 2 shows a top view of an example comb electrode structure which may be used for the electrode layer 140.

As illustrated, the comb layer electrode structure provides first finger electrodes 141 which are laterally spaced along the movement direction of the suspended mass 120 and second finger electrodes 142 which are laterally spaced along the movement direction of the suspended mass 120. The first finger electrodes 141 and the second finger electrodes 142 have a symmetric configuration, with the arrangement of the second finger electrodes 142 being rotated by 180° with respect to the arrangement of the first finger electrodes 141. The first finger electrodes 141 and the second finger electrodes 142 are interleaved so that, in one embodiment, between two of the first finger electrodes 141 there is always exactly one of the second finger electrodes 142, and between two of second finger electrodes 142 there is always exactly one of the first finger electrodes 141.

As further illustrated, the first finger electrodes 141 are connected to a first voltage terminal 140A, and the second finger electrodes are connected to a second voltage terminal 140B. The first voltage terminal 140A and the second voltage terminal 140B are located on opposite sides of the suspended mass 120 and extend over the suspension structures to the rest of the semiconductor substrate 100.

Further, FIG. 2 shows the trenches 130 forming defining the suspended mass 120 and further trenches 131 defining the elastically deformable suspension structures. Similar to the trenches 130, the further trenches 131 extend from the upper surface of the semiconductor substrate 100 to the cavity 110 (not shown in FIG. 2). In this way, the suspension structures may be defined to have desired deformation characteristics.

Figure 3:
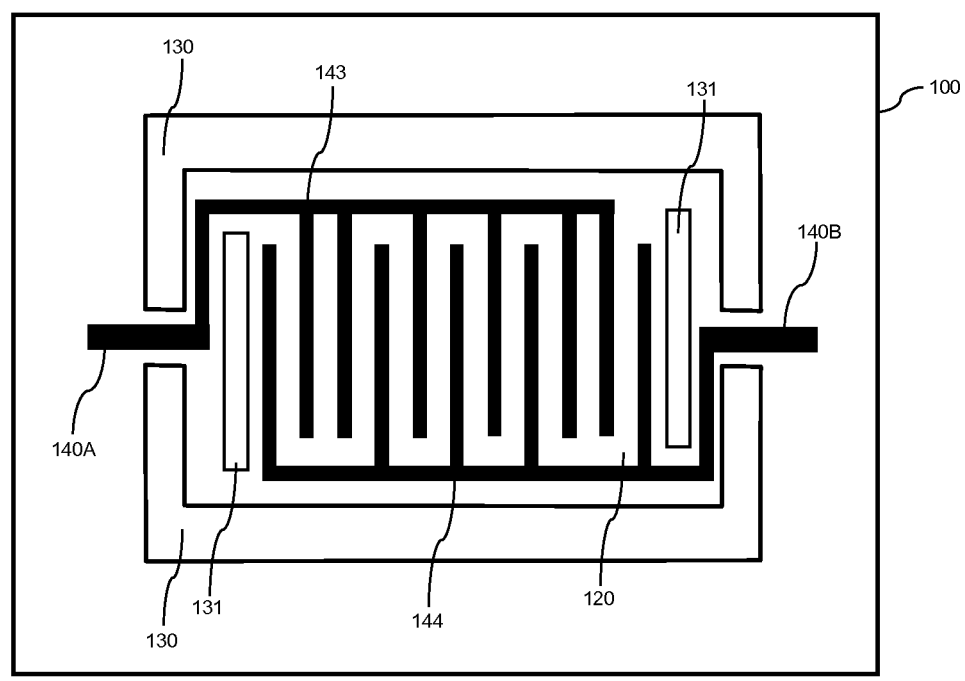
FIG. 3 shows a further electrode configuration according to an embodiment of the disclosure.

FIG. 3 shows a top view of a further example comb electrode structure which may be used for the electrode layer 140. The comb electrode structure of FIG. 3 is generally similar to that of FIG. 2, and elements of FIG. 3 which correspond to those of FIG. 2 have been designated with the same reference numerals. Also the comb electrode structure of FIG. 3 provides first finger electrodes 143 which are laterally spaced along the movement direction of the suspended mass 120 and second finger electrodes 144 which are laterally spaced along the movement direction of the suspended mass 120. However, in this case the first finger electrodes 143 and the second finger electrodes 144 have an asymmetric configuration and differ with respect to their number and spacing. The first finger electrodes 143 and the second finger electrodes 144 are interleaved so that an outermost pair of the first finger electrodes 143 is arranged between an outermost pair of the second finger electrodes 144. This asymmetric configuration may help to avoid excessive field strengths at the sides of the suspended mass 120 and thereby reduce the risk of a pull-in.

Figure 4:
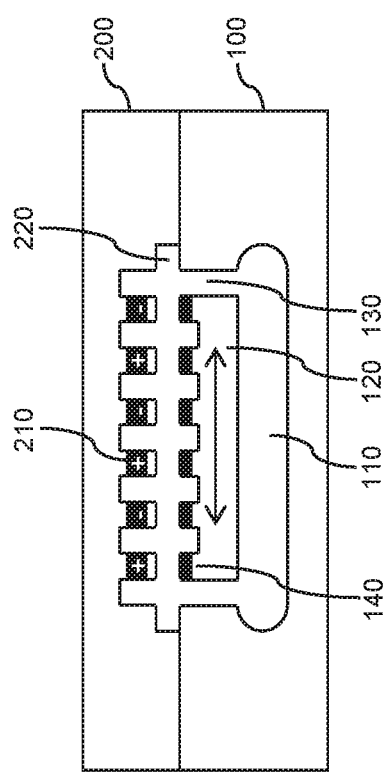
FIG. 4 shows a charging pattern of cover layer electrodes as utilized in an embodiment of the disclosure.

FIG. 4 shows an example pattern of charging the further electrode layer 210. As can be seen, the finger electrodes of the further electrode layer 210 are charged in an alternating pattern with opposite polarities. This may for example be achieved by providing the further electrode layer with a comb electrode structure which is similar to that of FIG. 2 or 3, i.e., has first finger electrodes and second finger electrodes which can be charged independently. The alternating pattern of opposite charges in the further electrode layer 210 may correspond to the alternating pattern of separately contacted first and second electrode fingers in the electrode layer 140. By providing the alternating pattern of opposite charges in the further electrode layer, the overall electrostatic force acting between the electrode layer 140 and the further electrode layer 210 can be reduced. This in turn helps to reduce the risk of a pull-in.

In the following, example processes for manufacturing the electronic device 10 will be explained in more detail by referring to FIGS. 5 to 10.

Initially, the cavity 110 may be formed in the semiconductor substrate. This may be achieved by a SON process as schematically illustrated in FIG. 5.

Figure 5:
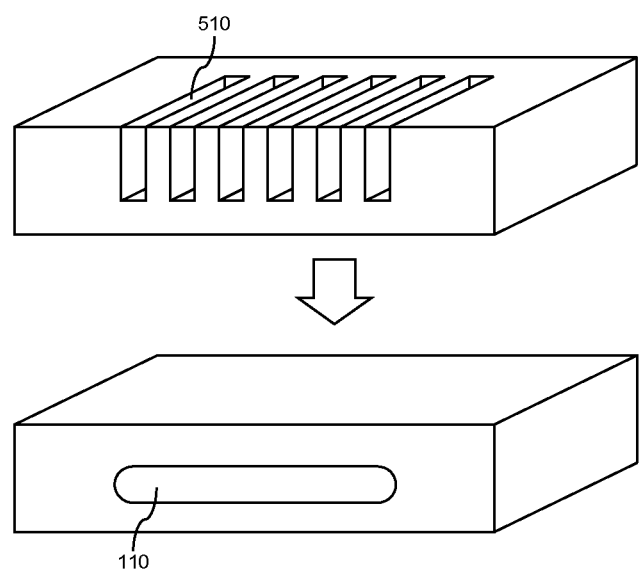
FIG. 5 schematically illustrates preparation of a cavity according to an embodiment of the disclosure.

As shown in FIG. 5, a set of parallel trenches 510 may be prepared to extend vertically from the upper surface of the semiconductor substrate 100 into the semiconductor substrate 100. The depth of the trenches 510 may be substantially the same as the desired depth of the cavity 110 beneath the upper surface. Then, the semiconductor substrate 100 may be subjected to a heat treatment which causes reformation of the upper surface of the semiconductor substrate 100, thereby filling the upper portions of the trenches 510 while causing merging of the lower portions of the trenches 510 to thereby form the cavity 110. As a result, the cavity 110 is formed beneath the upper surface of the semiconductor substrate 100. At this point, the cavity is completely embedded within the single crystal material of the semiconductor substrate 100.

Details concerning the implementation of the SON process may for example be found in "Fabrication of Silicon-on-Nothing Structure by Substrate Engineering . . . ", Sato et al, Japanese Journal of Applied Physics, Vol. 43, No. 1, 2004, pp. 12-18, which is hereby incorporated by reference.

Figure 6:
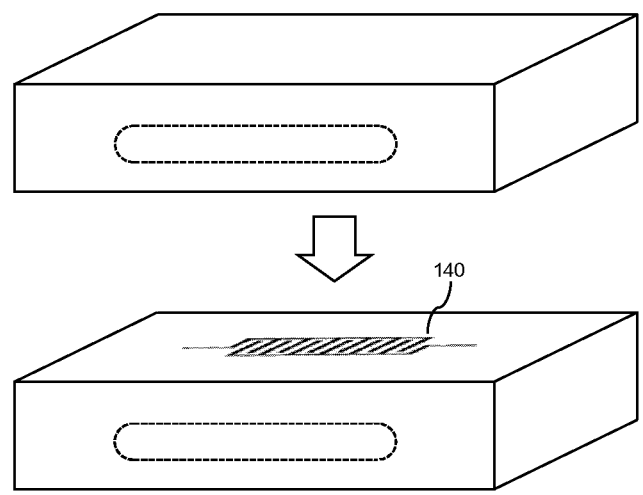
FIG. 6 schematically illustrates preparation of an electrode layer according to an embodiment of the disclosure.

As a next stage, the electrode layer 140 may be formed on the upper surface of the semiconductor substrate 100, as illustrated in FIG. 6. This may for example be achieved by depositing conductive semiconductor material or metal on the upper surface, using lithographic techniques to achieve the desired structure of the electrode layer 140. At this stage, also the recesses 150 between the electrode fingers of the electrode layer 140 may be formed. Further, also other electronic circuitry of the electronic device 10 may be formed on the upper surface of the semiconductor substrate 100.

Figure 7:
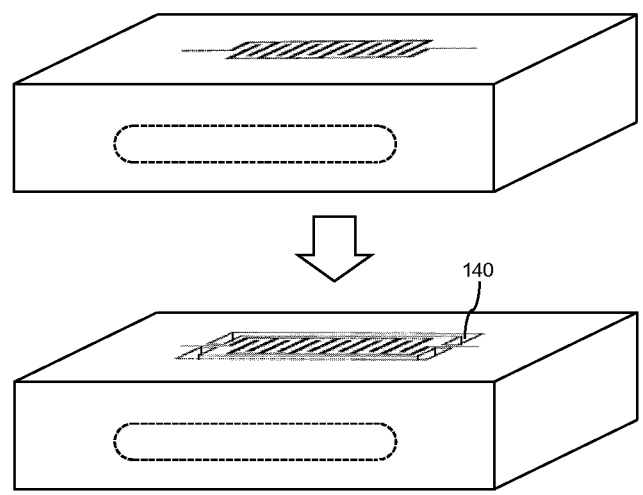
FIG. 7 schematically illustrates definition of a suspended mass according to an embodiment of the disclosure.

FIG. 7 illustrates the definition of the suspended mass 120 by the trenches 130. The trenches 130 may for example be formed by dry etching into the upper surface of the semiconductor substrate 100. The trenches 130 are formed sufficiently deep to reach the cavity 110 formed beneath the upper surface of the semiconductor substrate 100.

Figure 8:
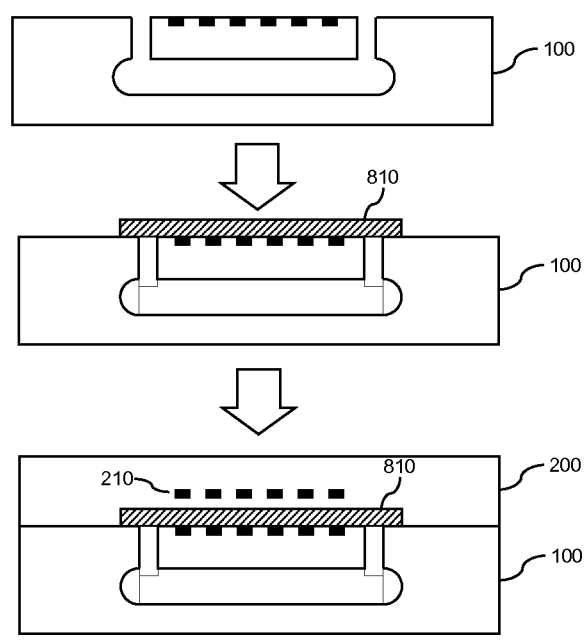
FIG. 8 schematically illustrates preparation of a cover layer according to an embodiment of the disclosure.

As a next stage, the cover layer 200 may be formed. As illustrated by FIG. 8, this may involve first forming a sacrificial layer 810 covering the suspended mass 120 and the trenches 130. As illustrated, the sacrificial layer may be formed to cover substantially only the suspended mass 120. However, in some scenraions the sacrificial layer 810 may also (at least partially) fill the trenches 130 and the cavity 110. The sacrificial layer 810 may for example be carbon based to facilitate its later removal by a dry process. Then the cover layer 200 may be deposited on the upper surface of the semiconductor substrate 100 and on the sacrificial layer 810. As part of this process, also the further electrode layer 210 may be formed within the cover layer 200, e.g., by using lithographic techniques to apply the conductive material of the further electrode layer 210 with the desired pattern.

Figure 9:
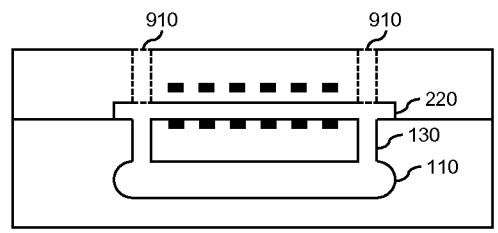
FIG. 9 schematically illustrates removal of a sacrificial layer according to an embodiment of the disclosure.

As illustrated by FIG. 9, the sacrificial layer 810 may then be removed. This may be achieved by a dry process, e.g., by ashing in an oxidizing atmosphere, through passages 910 formed in the cover layer 200. After removal of the sacrificial layer 810, the passages 910 may be sealed. Before sealing the passages 910, the empty space formed by the cavity 110, the trenches 130, and the gap 220 may be formed with a suitable gas, e.g., nitrogen.

Figure 10:
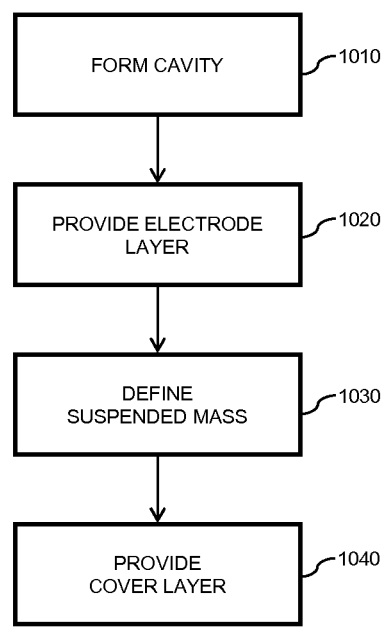
FIG. 10 shows a flowchart for schematically illustrating a method of manufacturing an electronic device according to an embodiment of the disclosure.

FIG. 10 shows a flowchart which illustrates an example method of manufacturing an electronic device. The method may for example be applied for manufacturing the above-mentioned electronic device 10 and may be based on process acts as explained in connection with FIGS. 5 to 10. The electronic device may for example be an electromechanical accelerometer or an electromechanical energy harvester.

At 1010, a cavity is formed in a single crystal semiconductor substrate. For example, act 1010 may involve forming the cavity 110 in the semiconductor substrate 100. The semiconductor substrate may for example be a silicon substrate. The cavity may be formed by a SON process, e.g., as explained in connection with FIG. 5, in one embodiment.

At 1020, an electrode layer is formed on one side of the semiconductor substrate. For example, act 1020 may involve forming the electrode layer 140 on the upper surface of the semiconductor substrate 100, e.g., as explained in connection with FIG. 6, in one embodiment. Together with the electrode layer, also other electronic circuitry may be formed on the semiconductor substrate. Accordingly, the electrode layer may be efficiently integrated with such other electronic circuitry. The electrode layer may be based on conducting semiconductor material and/or on metal. The electrode layer may include a first set of comb like electrode fingers. Act 1020 may also involve providing recesses separating electrode fingers of the first set of comb like electrode fingers, such as the above-mentioned recesses 150.

At 1030, a suspended mass is defined in the semiconductor substrate. For example, act 1030 may involve defining the suspended mass 120 from the semiconductor substrate 100, e.g., as explained in connection with FIG. 7, in one embodiment. The suspended mass may be defined by one or more trenches extending from the surface of the semiconductor substrate to the cavity. Examples of such trenches are the above-mentioned trenches 130. The suspended mass is defined in such a manner that the electrode layer formed at 1020 is located on the suspended mass. The suspended mass is movably suspended, typically by one or more suspension structures formed between the suspended mass and the rest of the semiconductor substrate. The suspended mass may for example be moveable in a lateral direction which extends parallel to the surface of the semiconductor substrate.

At 1040, a cover layer is provided. For example, act 1040 may involve providing the cover layer 200 on the semiconductor substrate 100, e.g., as explained in connection with FIGS. 8 and 9, in one embodiment. The cover layer includes a further electrode layer which is arranged opposite to the electrode layer formed at 1020 and spaced therefrom by a gap. An example of such further electrode layer is the further electrode layer 210 which is spaced by the gap 220 from the electrode layer 140. The further electrode layer may be formed as an electret layer with electrodes embedded in a dielectric material. The further electrode layer may include a second set of comb like electrode fingers. Act 1040 may also involve providing recesses separating electrode fingers of the second set of comb like electrode fingers, such as the above-mentioned recesses 230. The cover layer formed at 1040 may also seal an empty space which is formed by the cavity, the trenches defining the suspended mass, and the gap between the cover layer and the suspended mass.

If the electrode layer formed on the suspended mass includes a first set of comb like electrode fingers and the further electrode layer formed in the cover layer includes a second set of comb like electrode fingers, the movement of the suspended mass may extend at least between a first position, in which each electrode finger of the first set is aligned with an electrode finger of the second set, and a second position, in which each electrode finger of the first set is aligned with a space between two electrode fingers of the second set.

It should be noted that the acts of the method of FIG. 10 do not need to be performed in the illustrated order. For example, the electrode layer on the surface of the semiconductor substrate could also be formed after defining the suspended mass.

It is to be understood that the above-described concepts and embodiments are susceptible to various modifications. For example, the concepts may be applied with respect to various kinds of electronic devices which are based on a suspended mass. Further, various kinds of semiconductor material and processing technologies could be utilized.

What is claimed is:

1. An electronic device, comprising:
a single, unitary semiconductor substrate;
a cavity embedded within the single, unitary semiconductor substrate, such that the single, unitary semiconductor substrate surrounds each surface of the cavity;
a movably suspended mass defined in the single, unitary semiconductor substrate by one or more trenches extending from one side of the single, unitary semiconductor substrate to the cavity;
a first electrode layer on the suspended mass; and
a cover layer covering the suspended mass and including a second electrode layer arranged opposite to, and vertically above, the first electrode layer and spaced therefrom by a gap,
wherein the first electrode layer includes a first set of comb like first electrode fingers;
wherein the second electrode layer includes a second set of comb like second electrode fingers,
wherein the first set of comb like electrode fingers comprises a first subset of first electrode fingers connected to a first voltage terminal and a second subset of first electrode fingers connected to a second, different voltage terminal,
wherein the second set of comb like electrode fingers comprises a first subset of second electrode fingers operable to be charged according to a first polarity and a second subset of second electrode fingers operable to be charged according to a second polarity which is opposite to the first polarity, and
wherein the first electrode layer comprises recesses separating electrode fingers of the first set of comb like electrode fingers, and wherein the recesses extend into the movable suspended mass.

2. The device according to claim 1,
wherein the second electrode layer comprises recesses separating second electrode fingers of the second set of comb like second electrode fingers.

3. The device according to claim 1,
wherein an arrangement of the first subset of first electrode fingers of the first set of comb like first electrode fingers is asymmetric with respect to an arrangement of the second subset of first electrode fingers of the first set of comb like first electrode fingers.

4. The device according to claim 1,
wherein the second electrode layer comprises an electret layer with electrodes embedded in a dielectric material.

5. An electronic device, comprising:
a single, unitary semiconductor substrate;
a cavity embedded within the single, unitary semiconductor substrate, such that the single, unitary semiconductor substrate surrounds each surface of the cavity;
a movably suspended mass defined in the single, unitary semiconductor substrate by one or more trenches extending from one side of the single, unitary semiconductor substrate to the cavity;
a first electrode layer on the suspended mass; and
a cover layer covering the suspended mass and including a second electrode layer arranged opposite to, and vertically above, the first electrode layer and spaced therefrom by a gap,
wherein the first electrode layer includes a first set of comb like first electrode fingers;
wherein the second electrode layer includes a second set of comb like second electrode fingers,
wherein the first set of comb like electrode fingers comprises a first subset of first electrode fingers connected to a first voltage terminal and a second subset of first electrode fingers connected to a second, different voltage terminal,
wherein the second set of comb like electrode fingers comprises a first subset of second electrode fingers operable to be charged according to a first polarity and a second subset of second electrode fingers operable to be charged according to a second polarity which is opposite to the first polarity,
wherein the first electrode layer comprises recesses separating electrode fingers of the first set of comb like electrode fingers, and wherein the recesses extend into the movable suspended mass, and wherein the suspended mass is moveable at least between a first position, in which each first electrode finger of the first set of comb like first electrode fingers is aligned with a second electrode finger of the second set of comb like second electrode fingers, and a second position, in which each first electrode finger of the first set of comb like first electrode fingers is aligned with a space between two second electrode fingers of the second set of comb like second electrode fingers.

6. The device according to claim 5, wherein the second electrode layer comprises recesses separating second electrode fingers of the second set of comb like second electrode fingers.

7. The device according to claim 5, wherein an arrangement of the first subset of first electrode fingers of the first set of comb like first electrode fingers is asymmetric with respect to an arrangement of the second subset of first electrode fingers of the first set of comb like first electrode fingers.

8. The device according to claim 5, wherein the second electrode layer comprises an electret layer with electrodes embedded in a dielectric material.

\* \* \* \* \*